United States Patent
Alonso et al.

(10) Patent No.: US 10,700,602 B1
(45) Date of Patent: Jun. 30, 2020

(54) APPARATUS AND METHOD FOR DYNAMICALLY STABILIZING CURRENT LIMITING IN A PORTABLE COMMUNICATION DEVICE

(71) Applicant: MOTOROLA SOLUTIONS, INC., Chicago, IL (US)

(72) Inventors: Kevin Alonso, Davie, FL (US); David W. Henry, Miramar, FL (US); Michael Hand, Coral Springs, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/654,877

(22) Filed: Oct. 16, 2019

(51) Int. Cl.
| | |
|---|---|
| *H02M 3/04* | (2006.01) |
| *H03F 3/24* | (2006.01) |
| *H02J 7/00* | (2006.01) |
| *H04L 5/16* | (2006.01) |
| *H04W 4/10* | (2009.01) |

(52) U.S. Cl.
CPC .............. *H02M 3/04* (2013.01); *H02J 7/0063* (2013.01); *H03F 3/245* (2013.01); *H04L 5/16* (2013.01); *H04W 4/10* (2013.01); *H02J 2007/0067* (2013.01); *H03F 2200/171* (2013.01); *H03F 2200/451* (2013.01)

(58) Field of Classification Search
CPC ......... H02M 3/04; H02J 7/0063; H03F 3/245; H04L 5/16; H04W 4/10
See application file for complete search history.

(56) References Cited

U.S. PATENT DOCUMENTS

| | | |
|---|---|---|
| 8,723,494 B2 | 5/2014 | Galloway et al. |
| 10,263,415 B1 | 4/2019 | Bartels et al. |
| 10,285,081 B1 | 5/2019 | Bartels et al. |
| 2006/0152203 A1* | 7/2006 | Perry ................ H02M 3/33507 323/283 |
| 2007/0082630 A1* | 4/2007 | Aridas ................ H03G 3/3042 455/127.2 |

* cited by examiner

*Primary Examiner* — Nguyen T Vo
(74) *Attorney, Agent, or Firm* — Barbara R. Doutre

(57) ABSTRACT

A battery operated portable communication device is provided with improved transmitter current limit stabilization via a current limit stabilization circuit operatively coupled to the battery and a DC-to-DC converter of the transmitter. The current limit stabilization circuit provides a variable stabilizing reference voltage which is directly proportional to the supply voltage. The current limit stabilization circuit generates a voltage limit output voltage that controls both the power to the transmitter (120) and limits current to the transmitter.

20 Claims, 4 Drawing Sheets

US 10,700,602 B1

APPARATUS AND METHOD FOR DYNAMICALLY STABILIZING CURRENT LIMITING IN A PORTABLE COMMUNICATION DEVICE

FIELD OF THE INVENTION

This application pertains to portable communication devices and more particularly to current limiting of a DC-to-DC converter used to supply a transmitter of a portable communication device.

BACKGROUND OF THE INVENTION

Portable battery powered communication devices are often utilized in public safety environments, such as law enforcement, fire rescue, and the like, to provide mission critical communications operating over a public safety platform, such as, for example, a land mobile radio (LMR) platform. There is an increased desire to expand the functionality of public safety communication devices to incorporate additional features that run on different operating platforms, other than the main public safety platform. A DC-to-DC converter may be incorporated within a portable communication device to operate as a power supply for a transmitter, and it is important that transmit currents associated with the different features be managed appropriately. Variations in current at the DC-to-DC converter may cause resets or a loss of communication. Hence, current limiting remains a challenge to be addressed in new portable battery powered devices incorporating a DC-to-DC converter.

Improved power management approaches are needed. Size, cost, and weight are all relevant considerations to such power management approaches. For example, adding more battery cells is considered undesirable due the impact on cost, size, and weight of the product. Additionally, the ability to retain mission critical functionality is very important to public safety usage.

Accordingly, there is need for a method and apparatus that limits variations in transmit current associated with a DC-to-DC converter of a portable battery powered communication device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
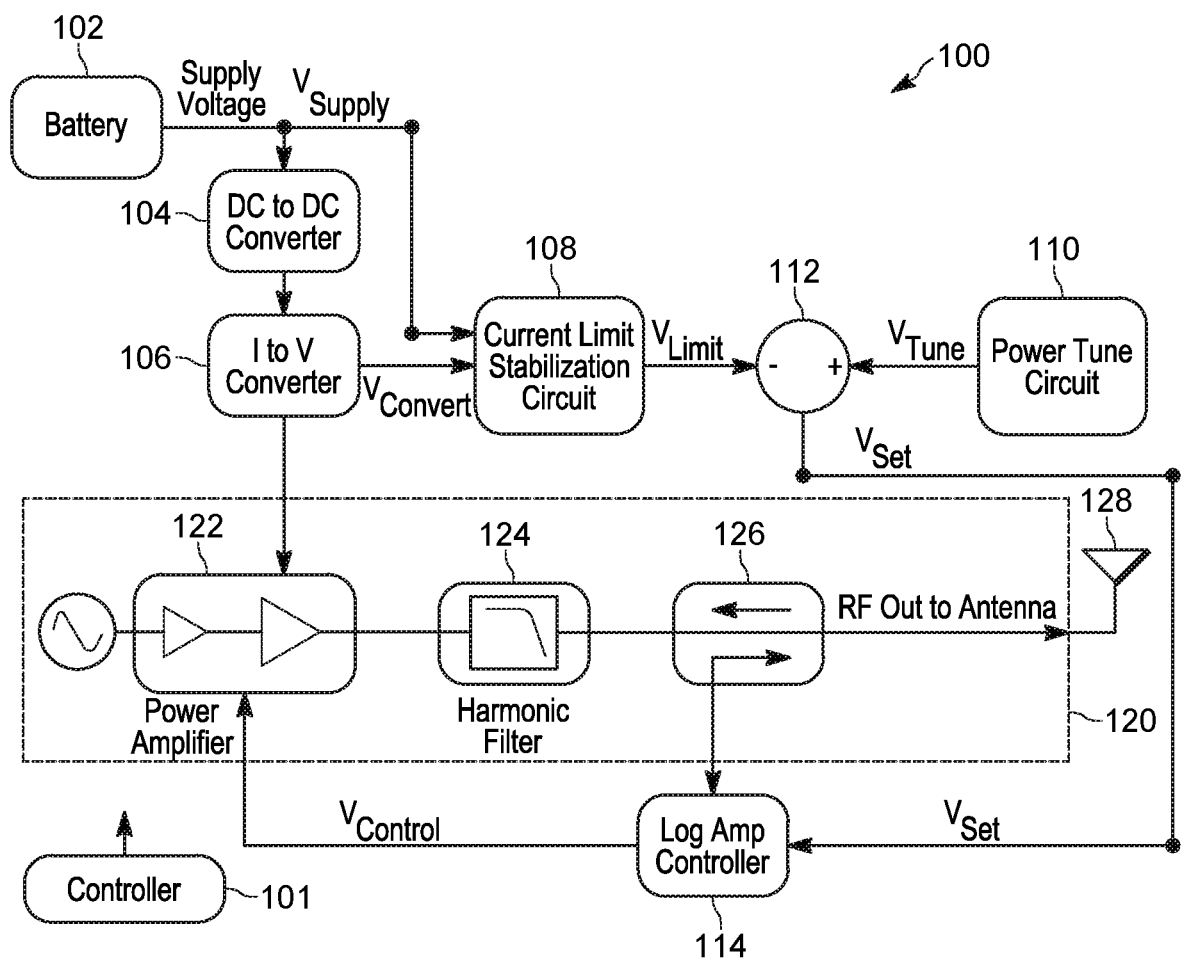
FIG. 1 is block diagram of transmitter section of a portable communication device formed and operating in accordance with various embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Briefly, there is provided herein a method and apparatus for dynamically stabilizing current limiting relative to an input voltage of a DC-to-DC converter in a transmitter of a portable battery operated communication device. The DC-to-DC converter is a constant power device, and its natural behavior is typically to increase current as input voltage is lowered, and to lower current as input voltage is increased. The embodiments provided herein advantageously add functionality to a current limiter which takes into account an input voltage to the DC-to-DC converter when current limiting is applied to the transmitter, thereby resulting in a current limit with significantly reduced variation.

Referring now to FIG. 1, there is shown a partial block diagram of a portable communication device 100 formed and operating in accordance with the various embodiments. Portable communication device 100 comprises a transmitter 120, such as a radio frequency (RF) transmitter, and a power control loop operatively coupled to the transmitter.

For the purposes of this application, the portable communication device may be a converged device or a non-converged device, under the control of one or more controllers 101. A non-converged device may provide, for example, land mobile radio (LMR) functionality to portable communication device 100 operating in a public safety band using a simplex (half duplex) mode of operation in which activating a push-to-talk (PTT) button of the device enables high power transmit mode and releasing the PTT causes the device to revert to receive/standby mode. The PTT transmit mode draws considerable current so current management of the RFPA is extremely important. A converged device provides a plurality of different radio platforms which rely on separate transmitters and antennas within a single housing/chassis which are supplied from the same battery. Each operational platform in the converged device has its own radio frequency transmitter (for example: LMR, LTE, Bluetooth, Wifi) presenting a different loading condition to the battery. The different platforms may provide for a converged device having half duplex and full duplex communication capabilities. Managing current though different, additional RF transmitters supplied by a common battery of a converged device is also extremely challenging due to the different loading conditions presented by the different platforms. The embodiments provided herein can be applied to one or more RF transmitters of a portable communication device.

In accordance with the various embodiments, the power control loop comprises a battery 102, a DC-to-DC converter 104, a current to voltage converter 106, and a current limit stabilization circuit 108. The battery 102 provides a supply voltage and current to the DC-to-DC converter 104, the DC-to-DC converter 104 converting the supply voltage to an up-converted voltage. The current to voltage converter 106 senses current on the up-converted voltage and generates a proportional current sense converted voltage (Vconvert). In accordance with the various embodiments, the current limit stabilization circuit 108 provides a variable stabilizing reference voltage directly proportional to the supply voltage input to the DC-to-DC converter 104. The current limit stabilization circuit 108 further subtracts the current sense converted voltage (Vconvert) from the variable stabilizing reference voltage to generate a voltage limit output voltage (Vlimit). In accordance with the various embodiments, the voltage limit output voltage (Vlimit) controls both power to the transmitter (120) and limits current through the transmitter 120.

The portable communication device further comprises a power tuning circuit 110 generating a tuning voltage and an adder/subtractor 112 that compares the voltage limit output and the power tuning voltage to generate a power set point voltage (Vset) which is applied to the transmitter 120. The transmitter 120 may comprise a radio frequency (RF) power amplifier 122 (RFPA), a harmonic filter 124 coupled to an output of the power amplifier, a radio frequency (RF) coupler 126 coupled to an output of the harmonic filter and to the logarithmic amplifier controller 114, and an antennas 128 coupled to an output of the RF coupler. The RF power amplifier 122 is supplied by the DC-to-DC converter 104. The voltage and current output of the DC to DC converter 104 passes through the current to voltage converter 106, where it senses the current being delivered to the transmitter by the DC-to-DC converter 104. The current passes through current to voltage converter 106 and is converted into a proportional voltage (Vconvert) that the rest of the power control loop uses to limit the current to the RFPA 122. For all practical purposes, the output of the DC-to-DC converter 104 and the output of the current to voltage converter 106 to the RFPA 122 are the same.

In accordance with the various embodiments, a logarithmic amplifier controller 114 is situated in a feedback loop of the power control circuit to the transmitter 120. The logarithmic amplifier controller 114 compares the power set point voltage (Vset) to the RF power output (RF Out) sensed trough the RF coupler 126 to generate a control voltage (Vcontrol), and the control voltage selectively controls one of two modes of operation. In a first normal operation mode, the control voltage (Vcontrol) controls output power of the transmitter to maintain a constant power. In a second mode of operation, the control voltage maintains a constant current to the transmitter in response to a current limit of the battery being reached.

Hence, the control voltage (Vcontrol) maintains constant power and/or constant current, as it is the only variable voltage going directly to the RFPA. What makes Vcontrol perform one mode or the other is dependent upon the power set point voltage (Vset). In the constant power case (below the current limit) Vset=Vtune which is a fixed value (tuned in a factory) and constant power is maintained by the control loop. When the current limit is reached, the current limit stabilization circuit takes over and Vset=Vtune−Vlimit. The voltage limit output voltage (Vlimit) is variable and is a function of the current into the RFPA (Vconvert) and the battery voltage (Vsupply). As a function of the subtraction (Vset=Vtune−Vlimit), where Vset is made variable as well. In other words, when Vset is fixed then power is controlled, and when Vset is variable then current is limited and indirectly power is controlled. In the variable Vset mode, power control is not the primary function of the loop, current limiting becomes the primary function.

The transmitter 120 receives a VCO signal which is amplified by the RFPA 122 and tuned via the control voltage (Vcontrol). The output signal from the RFPA 122 is then filtered at filter 124 and sensed at RF coupler 126 to generate a radio frequency (RF) power output at antenna 128. Advantageously, available battery power to the transmitter 120 is increased by the current stabilization circuit when the battery voltage to the DC-to-DC converter increases and available battery power to the transmitter is decreased by the current stabilization circuit when the battery voltage to the DC-to-DC converter decreases. This is an important advantage of the dynamically stabilized current limit apparatus provided herein, as the natural tendency of a DC to DC converter to maintain constant power consumption has been reduced. Hence, the behavior of the RFPA more closely tracks the available power from the battery.

Figure 2:
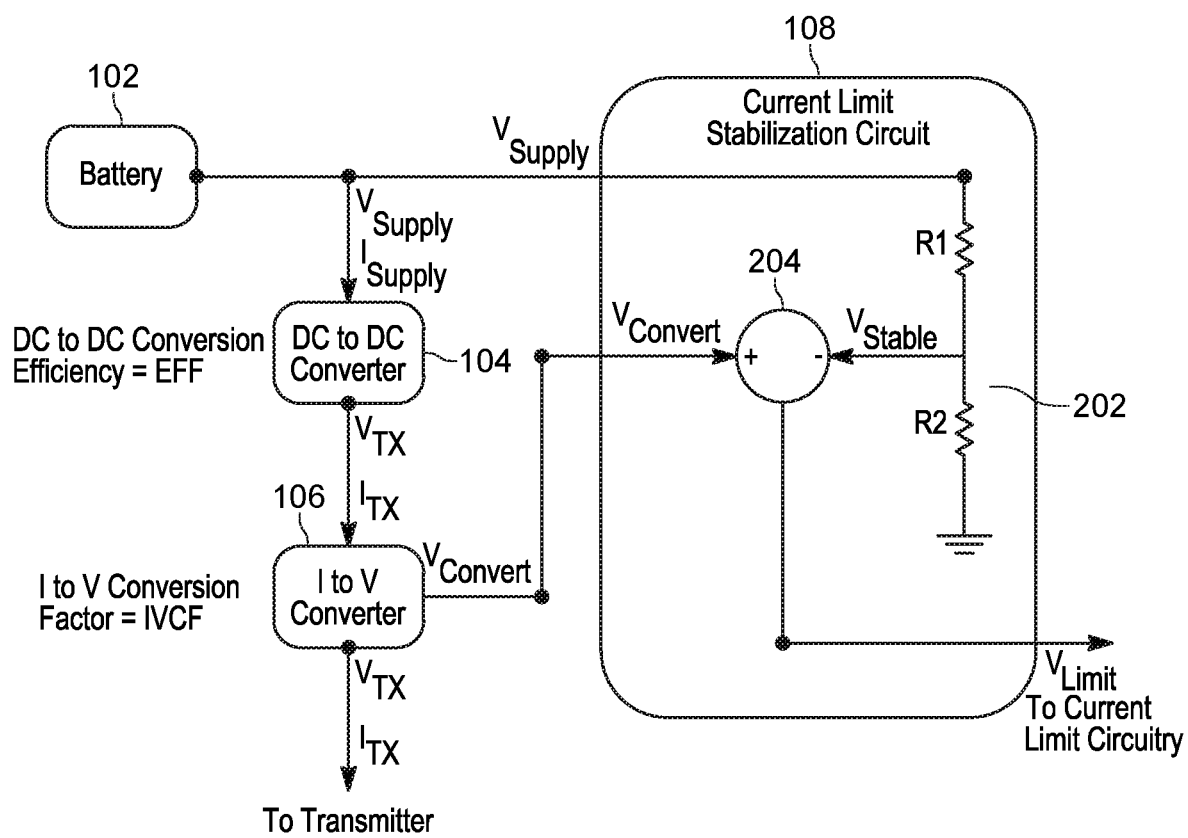
FIG. 2 is a more detailed block diagram of a current limiter of the transmitter section for the portable communication device of FIG. 1 in accordance with various embodiments.

FIG. 2 shows a more detailed block diagram of a current limiter of the transmitter section for the portable communication device of FIG. 1 in accordance with the various embodiments. The current limit stabilization circuit 108 sets the reference voltage (Vstable) used by the remaining current limit circuitry. The current limit stabilization circuit 108 comprises a voltage divider 202 and an adder/subtractor 204. In accordance with the various embodiments, the variable stabilizing reference voltage (Vstable) is set by the voltage divider 202 of the current limit stabilization circuit 108. The voltage divider 202 is coupled between the battery 102 and ground, the voltage divider operates as a floating reference point to provide the stabilizing variable reference voltage which varies in response to battery voltage. The adder/subtractor 204 subtracts the variable stabilizing reference voltage (Vstable) from the proportional current sense converted voltage (Vconvert) to generate the current limiting output voltage (Vlimit).

The reference voltage Vstable is directly proportional to the input voltage supply of the DC-to-DC converter. The Vstable voltage set by the divider is subtracted from the output of the current to voltage converter 106. When the converted transmit current exceeds the divider voltage (Vconvert>Vstable), then Vlimit is created to reduce the power of the RFPA. When the converted transmit current does not exceed the divider voltage (Vconvert<Vstable), then Vlimit is zero, and no limiting of power is placed on the RFPA. Hence, by incorporating the variable reference voltage Vstable, the current limit is held constant and the available battery power to the RFPA is advantageously increased when input voltage to the DC-to-DC converter is higher and reduced when the voltage is lower.

The following formulas summarize operation of the block diagrams of FIGS. 1 and 2.

$$V_{Convert} = I_{TX} * IVCF \text{(where ICVF is a current to voltage conversion factor)}$$

$$V_{Stable} = V_{Supply} * R2/(R1+R2)$$

The power control loop will use $V_{Limit}$ to guarantee that $V_{Convert} = V_{Stable}$ for an over current condition.

Therefore, $V_{Supply} = I_{TX} * IVCF * (R1+R2)/R2$.

Based on the efficiency of the DC-to-DC converter, $$I_{Supply} = I_{TX} * V_{TX}(V_{Supply} * EFF).$$

Combining all equations to derive, $I_{Supply} = V_{TX} * R2/[(R1+R2) * IVCF * EFF]$. Accordingly, the equation shows that supply current $I_{Supply}$ becomes entirely a function of constants and is therefore stabilized. The constants of the formula for $I_{Supply}$ being:

$V_{TX}$=output voltage of the DC to DC converter 104
R1, R2=resistor values of voltage divider 202
IVCF=current to voltage conversion factor the current to voltage converter 106
EFF=efficiency of the DC-to-DC converter 104.

Again, the embodiments may be applied to converged and non-converged devices. The stabilization of the supply current is extremely advantageous in that it provides for improved battery life and facilitates management of transmit features which may present different loading conditions under different operating platforms, thereby benefiting the overall architecture of current management in a portable battery operated communication device. For example, each transmitter of a converged device operating under different platforms would present different loading conditions to the battery. Each transmitter formed in accordance with the embodiments is now able to dynamically stabilize current limiting relative to the supply voltage and the supply current from the battery to each respective DC-to-DC converter.

Figure 3A:
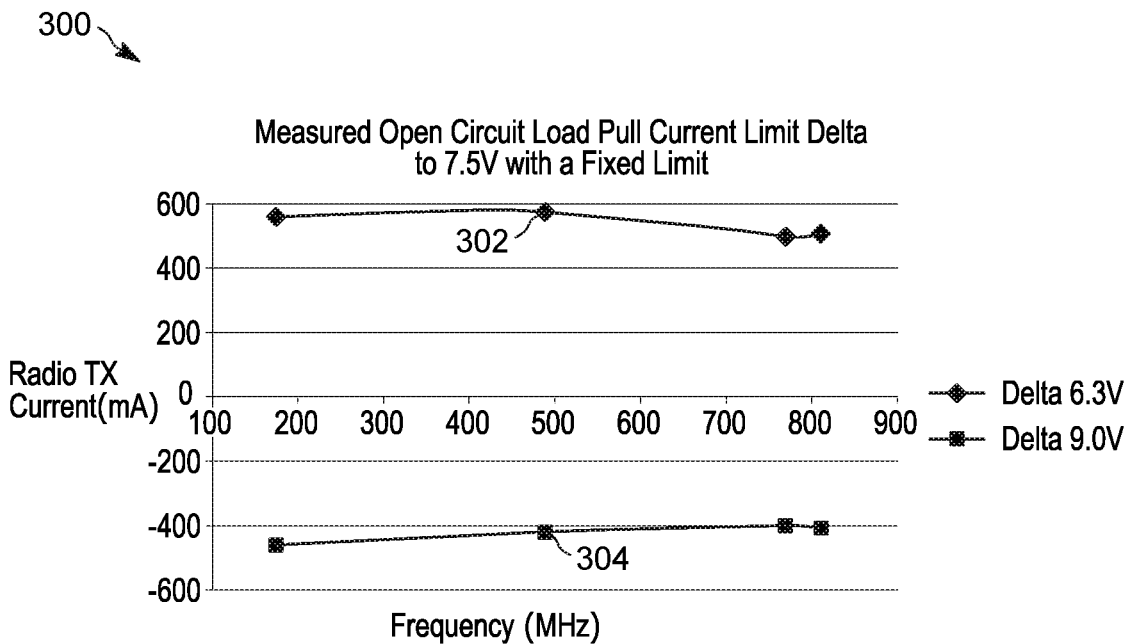
FIGS. 3A and 3B are example graphs comparing sample test results for fixed current limiting and voltage variable current limiting in accordance with various embodiments.
Figure 3B:
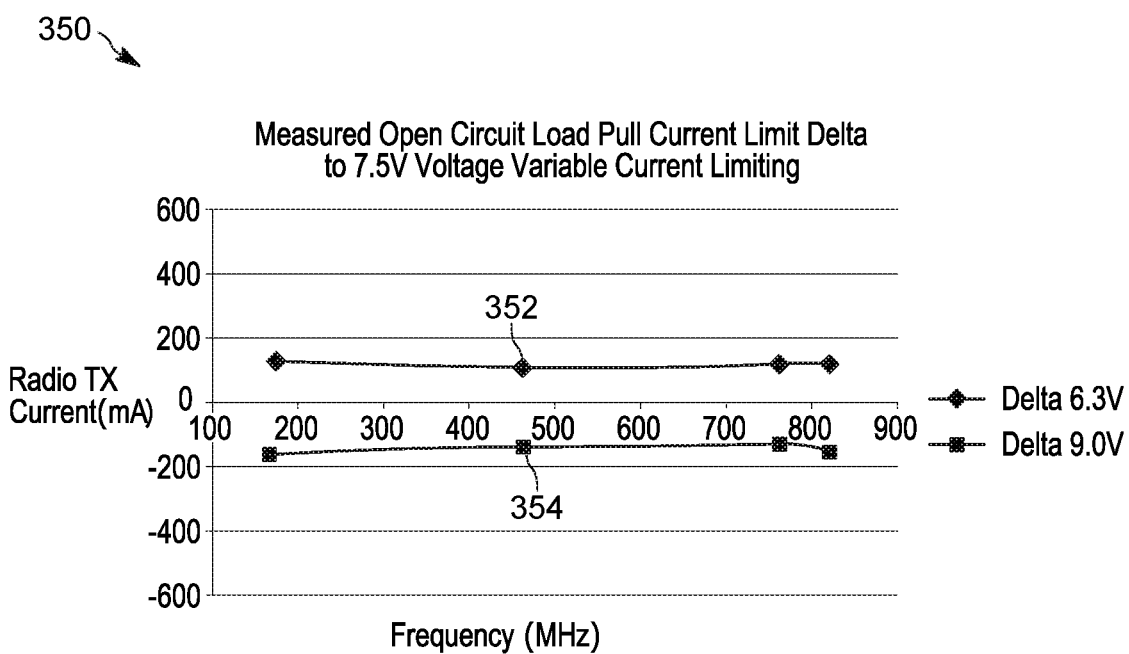

FIGS. 3A and 3B are example graphs of sample test results comparing fixed voltage current limiting approach (graph 300) and the dynamically stabilized current limiting approach (graph 350) in accordance with various embodiments. In the graphs 300 and 350, the variation or delta in current limit from a nominal condition is presented. For the two test cases presented, the nominal battery condition is 7.5 volts. A baseline of the transmitter current is taken at this battery voltage and into an open circuit condition. The open circuit at the output of the transmitter is used to guarantee that the transmitter will be operating in an extreme current limiting condition. The transmitter used in the tests is a broadband LMR transmitter that will operate in the VHF, UHF and 700/800 MHz LMR bands. The two data lines in each graph (data lines 302, 304 in graph 300, and data lines 352, 354 in graph 350) represent the delta from the nominal condition at the extreme ends of the battery voltage (9.0 volts for a fully charged battery and 6.3 volts for a depleted battery). The result shown in graph 300 is measured on a transmitter with power control that does not use the current limit stabilization circuit (108), but rather a fixed current limit reference to create the $V_{limit}$ signal (see FIGS. 1 and 3A). The data in graph 350 is for a transmitter and power control loop that replaces the fixed reference with the current limit stabilization circuit (108) to create a scalable $V_{limit}$ that is proportional to battery voltage (see FIG. 1 and FIG. 3B).

Referring to graph 300, the deviation in current limiting from the nominal 7.5V condition is presented for fixed reference current limiting scheme. With 7.5V being the nominal condition, the fixed limit is designed to give the desired current limiting result at this condition. As the battery voltage drops from 7.5V to 6.3V the fixed reference shows its limitation at data line 302, where there is an average increase in the current limit of approximately 500 mA. For the same fixed reference a fully charged battery at 9.0V again shows its limitation at data line 304, where the current limit has decreased approximately −400 mA from the nominal design condition. As can be seen with this approach, wherever the nominal design condition is chosen, there will be a large approximately 900 mA swing in the expected performance.

Referring to graph 350, the deviation in current limiting from the nominal 7.5V condition is presented for current limit stabilization circuit (108). With 7.5V being the nominal condition, the current limit stabilization circuit is designed to give the desired current limiting result at this condition. As the battery voltage depletes from 7.5V to 6.3V, the current limit stabilization circuit (108) delivers a significant reduction in variation as seen at data line 352, where there is an average increase in the current limit of approximately 100 mA. For the same current limit stabilization circuit (108), a fully charged battery at 9.0V again shows a significant improvement as seen at data line 354, where the current limit has decreased approximately −100 mA from the nominal design condition. As can be seen with this approach, wherever the nominal design condition is chosen, there will be a much smaller and more predictable 200 mA swing in the expected performance.

Accordingly, an improvement in current variation has been achieved by stabilizing the current limiting relative to the input voltage, with the current limit stabilization circuit (108). The improvement in the example provided is approximately 700 mA or (+/−350 mA) using the variable current limiting approach, as seen at graph 350, of the various embodiments. The implementation is highly practical and provides improved and more predictable performance over fixed reference current limiting methods.

Figure 4:
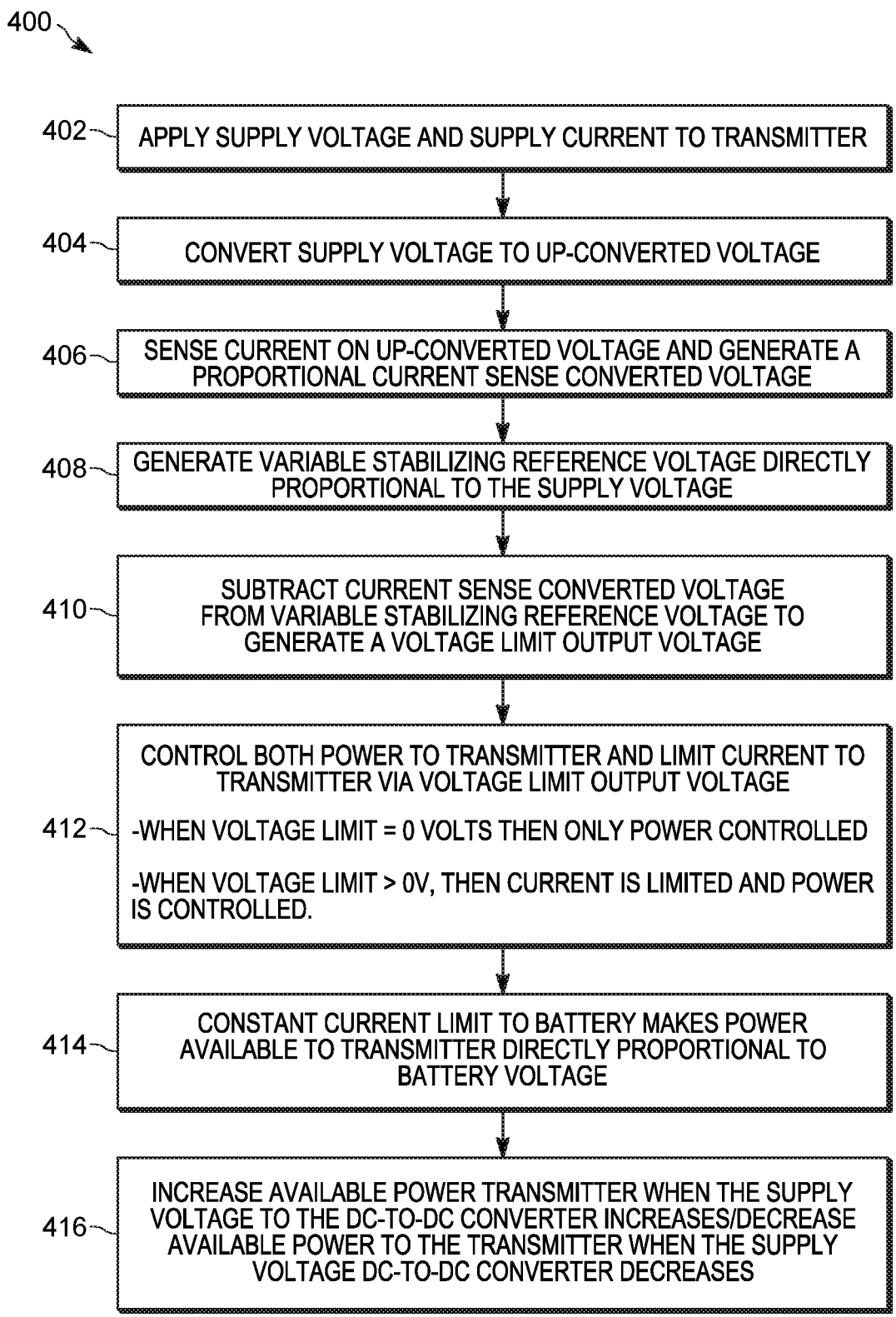
FIG. 4 is a flowchart of a method for managing current limiting in accordance with various embodiments.

FIG. 4 is a flowchart of a method for managing current limiting in a portable communication device in accordance with various embodiments. Method 400 beings by applying at 402, a supply voltage and supply current from a battery of the portable communication device to a transmitter of the portable communication device. The method continues at 404 by converting the supply voltage, using a DC-to-DC converter, to an up-converted voltage. The method continues at 406 by sensing current on the up-converted voltage, via a current to voltage converter, and generating a proportional current sense converted voltage. The method continues at 408 by generating a variable stabilizing reference voltage, using a current limit stabilization circuit, the variable stabilizing reference voltage being directly proportional to the supply voltage input to the DC-to-DC converter. This can be accomplished, as previously described by operating a voltage divider coupled between the battery (and ground, as a floating reference point to provide the stabilizing variable reference voltage which varies in response to battery voltage.

The method continues at 410 by subtracting the current sense converted voltage from the variable stabilizing reference voltage to generate a voltage limit output voltage. This can be accomplished, as previously described, by providing the proportional current sense converted voltage and the stabilizing variable reference voltage to a subtractor to generate the voltage limit output voltage.

The method continues at 412 by controlling both the power to the transmitter and limiting current to the transmitter using the voltage limit output voltage. When the voltage limit output is 0 volts only power is controlled, and when the voltage limit output is greater than zero volts current is limited and power is controlled. Hence, at 414 the constant current limit to the battery makes the power available to the transmitter directly proportional to the battery voltage. For example, at 416 the available power to the transmitter increases, via the voltage limit output voltage, when the supply voltage to the DC-to-DC converter increases, and the available power to the transmitter decreases, via the voltage limit output voltage, when the supply voltage to the DC-to-DC converter decreases. This result is achieved since the current limit stabilization circuit 108 in combination with the other power control circuitry described herein guarantees a fixed current limit to the battery. So available power consumption of the RFPA is directly proportional to the battery voltage.

The method 400 advantageously allows the supply current provided by the battery to be stabilized and limited via a function of constants, those constants being derived from the efficiency of the DC-to-DC converter 104 (EFF), the output voltage ($V_{TX}$) and the current to voltage conversion factor (IVCF) of the current to voltage converter 106 and the resistor values (R1, R2) of voltage divider 202 the current limitation stabilization circuit 108.

Accordingly, embodiments have been provided that dynamically stabilize current limiting in a battery operated portable communication device. The ability to dynamically stabilize current limiting is advantageous to both non-converged devices, such as public safety land mobile radio (LMR) devices, incorporating a DC-to-DC converter operating as a power supply for a transmitter, as well as to converged devices having a plurality of different RF transmitters and each with a respective DC-to-DC converter supplied by a common battery.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A portable communication device, comprising:
   a transmitter;
   a power control loop operatively coupled to the transmitter, the power control loop comprising:
   a battery providing a supply voltage and current;
   a DC-to-DC converter converting the supply voltage to an up-converted voltage;
   a current to voltage converter sensing current on the up-converted voltage and generating a proportional current sense converted voltage; and
   a current limit stabilization circuit providing a variable stabilizing reference voltage directly proportional to the supply voltage, the current limit stabilization circuit subtracting the current sense converted voltage from the variable stabilizing reference voltage to generate a voltage limit output voltage, the voltage limit output voltage controlling both the power to the transmitter and limiting current through the transmitter.

2. The portable communication device of claim 1, wherein the variable stabilizing reference voltage is directly proportional to the supply voltage input to the DC-to-DC converter.

3. The portable communication device of claim 1, wherein:
available power to the transmitter is increased by the current limit stabilization circuit when the supply voltage to the DC-to-DC converter increases; and
available power to the transmitter is decreased by the current limit stabilization circuit when the supply voltage to the DC-to-DC converter decreases.

4. The portable communication device of claim 1, wherein the variable stabilizing reference voltage is set by a voltage divider of the current limit stabilization circuit.

5. The portable communication device of claim 1, wherein the current limit stabilization circuit comprises:
a voltage divider coupled between the battery and ground, the voltage divider operating as a floating reference point to provide the stabilizing variable reference voltage which varies in response to battery voltage; and
an adder/subtractor for comparing the proportional current sense converted voltage to the variable stabilizing reference voltage to generate the voltage limit output voltage.

6. The portable communication device of claim 1, further comprising:
a power control circuit providing a feedback loop to the transmitter, the power control circuit comprising:
a power tuning circuit generating a power tuning voltage; and
an adder/subtractor comparing the voltage limit output and the power tuning voltage to generate a power set point voltage; and
a logarithmic amplifier controller comparing the power set point voltage to RF power output of the transmitter and generating a control voltage, wherein the control voltage controls output power of the transmitter to maintain a constant power in normal operation, and the control voltage maintains a constant current of the transmitter in response to a current limit to the battery being reached.

7. The portable communication device of claim 6, wherein the transmitter comprises:
a power amplifier receiving a VCO signal, the power amplifier being supplied by the DC-to-DC converter through the current to voltage converter, the power amplifier being tuned via the control voltage to generate a radio frequency (RF) power output.

8. The portable communication device of claim 6, wherein the transmitter comprises:
a power amplifier supplied by the DC-to-DC converter;
a harmonic filter coupled to an output of the power amplifier;
a radio frequency (RF) coupler being coupled to an output of the harmonic filter and an input of the logarithmic amplifier controller; and
an antenna coupled to an output of the RF coupler.

9. The portable communication device of claim 1, wherein the portable communication device is a portable battery operated radio.

10. The portable communication device of claim 1, wherein the portable communication device is a portable battery operated radio, and the transmitter is activated by a push-to-talk (PTT) button.

11. The portable communication device of claim 1, wherein the portable communication device is a battery operated land mobile radio (LMR) having an LMR transmitter.

12. The portable communication device of claim 1, wherein the portable communication device is a converged device providing a plurality of different radio platforms which rely on separate transmitters and antennas supplied from the battery, each of the transmitters presenting a different loading condition to the battery.

13. The portable communication device of claim 1, wherein supply current provided by the battery is stabilized and limited via a function of constants.

14. A method for managing current limiting in a portable communication device, comprising:
applying a supply voltage and a supply current from a battery of the portable communication device to a transmitter of the portable communication device;
converting the supply voltage, using a DC-to-DC converter, to an up-converted voltage;
sensing current on the up-converted voltage, via a current to voltage converter, and generating a proportional current sense converted voltage; and
generating a variable stabilizing reference voltage, using a current limit stabilization circuit, the variable stabilizing reference voltage being directly proportional to the supply voltage;
subtracting the current sense converted voltage from the variable stabilizing reference voltage to generate a voltage limit output voltage; and
the voltage limit output voltage controlling both power to the transmitter and limiting current to the transmitter using the voltage limit output voltage.

15. The method of claim 14, further comprising:
increasing available power to the transmitter, by the current limit stabilization circuit, when the supply voltage to the DC-to-DC converter increases; and
decreasing available power to the transmitter, by the current limit stabilization circuit when the supply voltage to the DC-to-DC converter decreases.

16. The method of claim 14, wherein the supply current provided by the battery is stabilized via a function of constants.

17. The method of claim 14, wherein the variable stabilizing reference voltage is directly proportional to the supply voltage input to the DC-to-DC converter.

18. The method of claim 14, wherein generating the variable stabilizing reference voltage using the current limit stabilization circuit comprises:
operating a voltage divider coupled between the battery and ground, as a floating reference point to provide the stabilizing variable reference voltage which varies in response to battery voltage; and
providing the proportional current sense converted voltage and the stabilizing variable reference voltage to a subtractor to generate the voltage limit output voltage.

19. The method of claim 14, wherein the portable communication device is a battery operated public safety land mobile radio.

20. The method of claim 14, wherein the portable communication device is a converged device comprising additional transmitters each with a respective DC-to-DC converter powered by the battery, each transmitter operating under different platforms presenting different loading conditions to the battery, and wherein each transmitter dynamically stabilizes current limiting relative to the supply voltage and the supply current provided by the battery to each respective DC-to-DC converter powering each additional transmitter.

\* \* \* \* \*